United States Patent
Hatakeyama

(10) Patent No.: US 9,197,792 B2
(45) Date of Patent: Nov. 24, 2015

(54) IMAGE PROCESSING METHOD, IMAGE PROCESSING APPARATUS AND IMAGE PICKUP APPARATUS

(75) Inventor: Koshi Hatakeyama, Tokyo (JP)

(73) Assignee: CANON KABUSHIKI KAISHA (JP)

( * ) Notice: Subject to any disclaimer, the term of this patent is extended or adjusted under 35 U.S.C. 154(b) by 0 days.

(21) Appl. No.: 14/006,491

(22) PCT Filed: Sep. 6, 2012

(86) PCT No.: PCT/JP2012/005667
§ 371 (c)(1),
(2), (4) Date: Sep. 20, 2013

(87) PCT Pub. No.: WO2013/038628
PCT Pub. Date: Mar. 21, 2013

(65) Prior Publication Data
US 2014/0028869 A1    Jan. 30, 2014

(30) Foreign Application Priority Data

Sep. 12, 2011 (JP) .................................. 2011-198286

(51) Int. Cl.
*H04N 5/225* (2006.01)
*H04N 5/232* (2006.01)
*G02B 27/00* (2006.01)
*H01L 27/146* (2006.01)

(52) U.S. Cl.
CPC ............ *H04N 5/225* (2013.01); *G02B 27/0075* (2013.01); *H04N 5/232* (2013.01); *H04N 5/23248* (2013.01); *H01L 27/14627* (2013.01)

(58) Field of Classification Search
None
See application file for complete search history.

(56) References Cited

U.S. PATENT DOCUMENTS 7,732,744 B2 * 6/2010 Utagawa .................... 250/208.1

FOREIGN PATENT DOCUMENTS

| JP | 2001197354 A | 7/2001 |
| JP | 2007-004471 A | 1/2007 |
| JP | 2009-105717 A | 5/2009 |

(Continued)

OTHER PUBLICATIONS

Japanese Office Action cited in Japanese counterpart application No. JP2011-198286, dated Jul. 15, 2014.
Lumsdaine, et al., "Full Resolution Lightfield Rendering", Adobe Technical Report, pp. 1-12, Jan. 2008.
Ng, et al., "Light Field Photography with a Hand-Held Plenoptic Camera", Stanford Tech Report CTSR Feb. 2005, pp. 1-11, 2005.
International Search Report for PCT/JP2012/005667, dated Oct. 9, 2012.

(Continued)

*Primary Examiner* — Twyler Haskins
*Assistant Examiner* — Angel L Garces-Rivera
(74) *Attorney, Agent, or Firm* — Rossi, Kimms & McDowell LLP

(57) ABSTRACT

The image processing method of producing, based on information on positions and angles of light rays obtained from a first image, a second image, the first image being produced by using an image pickup apparatus that introduces the light rays from an image capturing optical system (101) to an image sensor (102) through an optical element array (101c). The method includes a step of acquiring the first image and information on an image capturing condition at a time of producing the first image, a step of acquiring an image restoration filter corresponding to the information on the image capturing condition and corresponding to respective optical transfer functions of the image capturing optical system and the optical element array, a step of performing an image restoration process on the first image by using the image restoration filter, and a step of producing the second image by using the restored first image.

6 Claims, 9 Drawing Sheets

(56) References Cited

FOREIGN PATENT DOCUMENTS

| | | | |
|---|---|---|---|
| JP | 2011-151627 A | | 8/2011 |
| JP | 2011151627 A | * | 8/2011 |

OTHER PUBLICATIONS

Official Action issued in JP2011-198286, mailed Dec. 16, 2014.

* cited by examiner

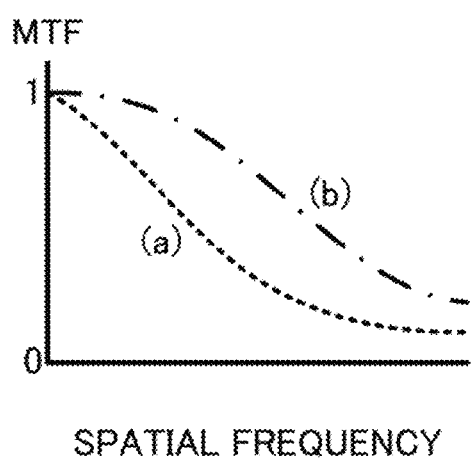
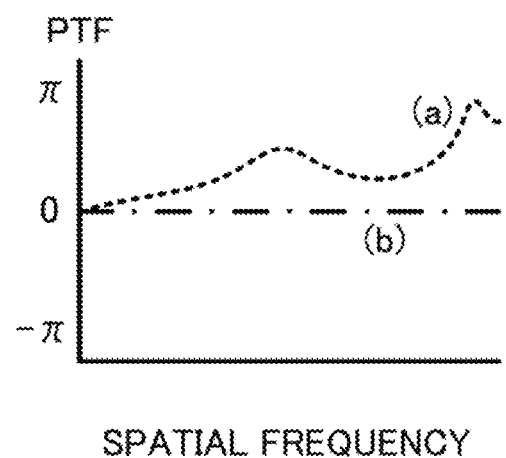
FIG. 8A
FIG. 8B

IMAGE PROCESSING METHOD, IMAGE
PROCESSING APPARATUS AND IMAGE
PICKUP APPARATUS

TECHNICAL FIELD

The present invention relates to an image processing technique for producing a new image from a digital image captured by an image pickup apparatus in which light rays from an image capturing optical system are introduced to an image sensor through an optical element array such as a microlens array.

BACKGROUND ART

Various methods are proposed, each of which reconstructs various images from a digital image produced by image capturing and outputs them. For example, a plenoptic camera proposed in "Light Field Photography with a Hand-held Plenoptic Camera" (hereinafter referred to as NPL 1) uses a light field photography technique to obtain information on positions and angles of light rays from an object, that is, light field information.

Description will be made of the plenoptic camera with reference to FIG. 1. The plenoptic camera is provided with a microlens array 101c disposed at an imaging position of an image capturing optical system 101 that is constituted by a main lens group 101b and an aperture stop 101a, and with an image sensor 102 disposed at a rear of the microlens array 101c. The microlens array 101c serves as a separator to prevent light rays passing a certain point A in an object space from mixing with light rays passing a point near the point A on the image sensor 102. As understood from FIG. 1, an upper ray, a principal pay and a lower ray from the point A are respectively received by mutually different pixels on the image sensor 102. Therefore, the image sensor 102 can photoelectrically convert the light rays passing the point A and separated according to their angles.

On the other hand, "Full Resolution Light Field Rendering" (hereinafter referred to as NPL 2) proposes another method of acquiring the light field information, which is shown in FIGS. 2 and 3. Constituent elements shown in FIGS. 2 and 3 are same as those shown in FIG. 1. In FIG. 2, the microlens array 101c disposed at a rear of the imaging position of the main lens group 101b causes the light rays passing the point A to reform images on the image sensor 102, which makes it possible to acquire (photoelectrically convert) the light rays passing the point A and separated according to their angles. In FIG. 3, the microlens array 101c disposed at a front of the imaging position of the main lens group 101b causes the light rays passing the point A to form images on the image sensor 102, which makes it possible to acquire the light rays passing the point A and separated according to their angles. The microlens array 101c shown in FIG. 2 reforms a real image of the main lens group 101b, and on the other hand, the microlens array 10c shown in FIG. 3 forms a virtual image of the main lens group 10b.

The plenoptic camera proposed in NPL 1 and the method proposed in NPL 2 are different from each other in principle of acquisition of the light field information. However, the light field information acquired by each of these methods makes it possible to reconstruct, by using image processing, an image corresponding to an arbitrary focus position or an image viewed from an arbitrary viewing direction.

Moreover, Japanese Patent Laid-Open No. 2009-105717 (hereinafter referred to as "PTL 1") discloses a method for suppressing generation of aberration in a microlens array, which sets a focal length of the microlens to be smaller than a product of twice a depth resolution required for an image pickup apparatus and a lateral magnification of an image capturing optical system.

CITATION LIST

Patent Literature

[PTL 1] Japanese Patent Laid-Open No. 2009-105717

Non Patent Literature

[NPL 1] "Light Field Photography with a Hand-held Plenoptic Camera" (Ren Ng et al. Stanford Tech Report CTSR 2005-2)

[NPL 2]"Full Resolution Light Field Rendering" (Todor Georgive et al., Adobe Technical Report January 2008)

SUMMARY OF INVENTION

Technical Problem

However, aberration is generated not only in the microlens array, but also in the image capturing optical system. The aberration of the image capturing optical system in this description includes spherical aberration, comatic aberration, field curvature, astigmatism and others. These aberrations are generated because a light flux emitted from one point of an object forms an image with some divergence on an image pickup surface of an image sensor, the light flux being normally converged at one point if there is no aberration or diffraction.

Moreover, color blur in a color image generated due to longitudinal chromatic aberration, chromatic spherical aberration or chromatic comatic aberration of the image capturing optical system can be said to be a difference between blurring degrees of respective light wavelengths. Furthermore, lateral color shift caused by chromatic aberration of magnification of the image capturing optical system can be said to position shift or phase shift due to difference in image capturing magnifications for respective light wavelengths.

The aberration generated in the image capturing optical system shifts positions on the image sensor 102 where the light rays passing the point A in FIG. 1 reach, from positions where these light rays should reach when the aberration is not generated. FIG. 4A shows a case where the aberration is not generated in the image capturing optical system, and therefore the light rays from the image capturing optical system reach the positions (pixels) on the image sensor 102 where they should reach.

On the other hand, FIG. 4B shows a case where the comatic aberration is generated in the image capturing optical system, and therefore the light rays from the image capturing optical system do not reach the positions where they should reach and have complex and asymmetric position shift. The other aberrations similarly cause the light rays from the image capturing optical system to reach positions shifted from positions where they should reach.

Such position shift of the light rays on the image sensor provides errors especially to the information on angles of the light rays (light field information), which makes it difficult to produce a reconstructed image with good accuracy. As shown in FIG. 1, the image sensor 102 is disposed away from the imaging position of the image capturing optical system 101, so that the coma aberration generated in the image capturing optical system is enlarged and appears as position shift of the light rays on the image sensor.

In addition, the aberration generated in the microlens array also generates such position shift of the light rays on the image sensor. The method disclosed in PTL 1 can reduce influence of the aberration generated in the microlens array. However, actual microlens arrays are often constituted as one lens element in a direction of an optical axis, which makes it difficult to sufficiently reduce the influence of the aberration by optical techniques.

The present invention provides an image processing technique capable of sufficiently reducing the influences of the aberrations generated in the image capturing optical system and optical lens array (such as the microlens array) and thereby producing an reconstructed image with good accuracy.

Solution to Problem

The present invention provides as an aspect thereof an image processing method of producing, based on information on positions and angles of light rays obtained from a first image, a second image, the first image being produced by using an image pickup apparatus that introduces the light rays from an image capturing optical system to an image sensor through an optical element array. The method includes a step of acquiring the first image and information on an image capturing condition at a time of producing the first image, a step of acquiring an image restoration filter corresponding to the information on the image capturing condition and corresponding to respective optical transfer functions of the image capturing optical system and the optical element array, a step of performing an image restoration process on the first image by using the image restoration filter to produce a restored first image, and a step of producing the second image by using the restored first image.

The present invention provides as another aspect thereof an image processing apparatus configured to produce, based on information on positions and angles of light rays obtained from a first image, a second image, the first image being produced by using an image pickup apparatus that introduces the light rays from an image capturing optical system to an image sensor through an optical element array. The image processing apparatus includes an inputting part configured to acquire the first image and information on an image capturing condition at a time of producing the first image, a filter acquiring part configured to acquire an image restoration filter corresponding to the information on the image capturing condition and corresponding to respective optical transfer functions of the image capturing optical system and the optical element array, a processing part configured to perform an image restoration process on the first image by using the image restoration filter to produce a restored first image, and an image producing part configured to produce the second image by using the restored first image.

The present invention provides as still another aspect thereof an image pickup apparatus including an optical element array through which light from an image capturing optical system pass, an image sensor configured to photoelectrically convert the light from the optical element array, and the above-mentioned image processing apparatus.

Other aspects of the present invention will become apparent from the following description and the attached drawings.

BRIEF DESCRIPTION OF DRAWINGS

FIGS. 8A and 8B respectively show amplitude and phase in the image processing method in each of Examples 1 and 2.

DESCRIPTION OF EXAMPLES

Figure 1:
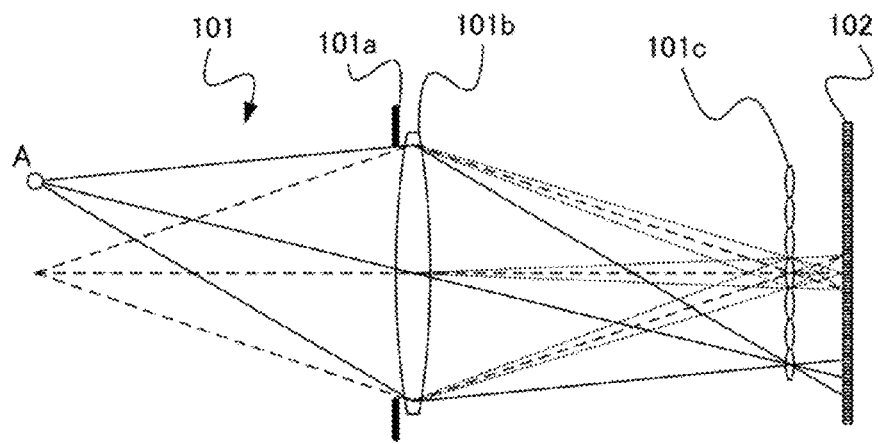
FIG. 1 shows an image capturing optical system, a microlens array and an image sensor of an image pickup apparatus that is Example 1 of the present invention.

Exemplary Examples of the present invention will hereinafter be described with reference to the accompanying drawings.

First of all, prior to description of the Examples, description will be made of definition of terms to be used in each Example and an image restoration process performed in each Example.

"Input Image"

The input image is a digital image produced by image capturing, that is, by using output from an image sensor that is provided in an image pickup apparatus and photoelectrically converts an object image formed by an optical system (constituted by an image capturing optical system and an optical element array such as a microlens array in each Example). This digital image is degraded according to an optical transfer function (OTF) including aberrations of the optical system constituted by optical elements such as lenses and various optical filters. The image sensor is constituted by a photoelectric conversion element such as a CCD sensor or a CMOS sensor. The image capturing optical system may be constituted by reflective surfaces such as mirrors each having curvature. Moreover, the image capturing optical system may be detachably attachable (interchangeable) to the image pickup apparatus. In the image pickup apparatus, the image sensor and a signal processor that produces the digital image (input image) by using the output from the image sensor constitute an image capturing system.

The input image has information on color components such as R, G and B components. The color components can be also expressed by, other than the RGB, any selected one of general color spaces such as LCH (lightness, chroma and hue), YCbCr (luminance, blue color difference and red color difference), XYZ, Lab, Yuv and JCh, or can be expressed by color temperature.

The input image and a restored image (output image) can be provided with information on an image capturing condition in the image pickup apparatus at a time of producing the input image, the image capturing condition including a focal length and an aperture value of the image capturing optical system, an image capturing distance (object distance) and the like. The information on the image capturing condition is hereinafter referred to as "image capturing condition information". In addition, the input image can be provided with various correction information to be used for correction of the input image.

When outputting the input image from the image pickup apparatus to an image processing apparatus separated therefrom and performing the image restoration process in the image processing apparatus, it is desirable to add the image capturing condition information and the correction information to the input image. The image processing apparatus can receive the image capturing condition information and the correction information from the image pickup apparatus not only by addition to the input image, but also through direct or indirect communication and through a storage medium detachably attachable to these apparatuses.

"Optical Transmission Function (OTF)"

Fourier transform of a point spread function (PSF) provides an optical transfer function (OTF) showing frequency component information on aberration and being expressed by a complex number. An absolute value of the optical transfer function (OTF), that is, an amplitude component is called a modulation transfer function (MTF), and a phase component is called a phase transfer function (PTF). The MTF and PTF respectively show frequency characteristics of amplitude and phase components of image degradation due to aberration. In the following description, the phase component (PTF) is expressed as a phase angle by the following expression where Re(OTF) and Im(OTF) respectively represent a real part and an imaginary part of the OTF.

$$PTF = \tan^{-1}[Im(OTF)/Re(OTF)]$$

Thus, the optical transfer function (OTF) of the optical system provides degradation to the amplitude and phase components of the image, so that, at an imaging position, an image corresponding to each point of an object includes asymmetric blur like comatic aberration.

Moreover, chromatic aberration of magnification is generated in an image pickup apparatus that captures, according to its spectral characteristics, color components such as R, G and B whose imaging positions are mutually shifted due to differences of imaging magnifications of its optical system for respective light wavelengths. Therefore, not only the shift of the imaging positions among the color components is generated, but also shift of imaging positions among wavelengths in each color component, that is, image spread due to the phase shift is generated. Accordingly, the chromatic aberration of magnification is not exactly merely parallel color shift, but influences image spread in a certain color channel such as a G channel.

"Image Restoration Process"

As a method for correcting the degradation of the amplitude component (MTF) and the degradation of the phase component (PTF) in the degraded image (input image), there is known a method using information on the optical transfer function (OTF) of the optical system. This method is referred to as "image restoration" or "image recovery", and a process for correcting the degraded image by using the information on the optical transfer function (OTF) of the optical system is hereinafter referred to as "an image restoration process (or image restoration)".

The outline of the image restoration process is as follows. When g(x,y) represents an input image (degraded image), f(x,y) represents a non-degraded original image, h(x,y) represents the point spread function (PSF) that forms a Fourier pair with the optical transfer function (OTF), * represents convolution, and (x,y) represents coordinates in the input image, the following expression is established:

$$g(x,y) = h(x,y) * f(x,y).$$

Converting the above expression into a form of a two-dimensional frequency surface through Fourier transform provides the following expression of a form of a product for each frequency:

$$G(u,v) = H(u,v) \cdot F(u,v)$$

where H represents a result of the Fourier transform of the point spread function (PSF), in other words, the optical transfer function (OTF), G and F respectively represent results of the Fourier transform of g and h, and (u,v) represents coordinates on the two-dimensional frequency surface, in other words, a frequency.

Dividing both sides of the above expression by H as below provides the original image from the degraded image produced by the image pickup apparatus:

$$G(u,v)/H(u,v) = F(u,v).$$

Returning F(u,v), that is, G(u,v)/H(u,v) to a real surface by inverse Fourier transform provides a restored image equivalent to the original image f(x, y).

When R represents a result of the inverse Fourier transform of $H^{-1}$, performing a convolution process for an image in the real surface as represented by the following expression also enables provision of the original image:

$$g(x,y) * R(x,y) = f(x,y).$$

This R(x,y) is an image restoration filter. When the input image is a two-dimensional image, the image restoration filter is generally also a two-dimensional filter having taps (cells) each corresponding to each of pixels of the two-dimensional image. Moreover, increase of the number of the taps (cells) in the image restoration filter generally improves image restoration accuracy, so that a realizable number of the taps is set depending on requested image quality, image processing capability, aberration characteristics of the optical system and the like.

Since the image restoration filter needs to reflect at least the aberration characteristics, the image restoration filter is different from a conventional edge enhancement filter (high-pass filter) or the like having about three taps in each of horizontal and vertical directions. The image restoration filter is produced based on the optical transfer function (OTF), so that it enables highly accurately correction of the degradation of the amplitude and phase components of the degraded image (input image).

Moreover, since an actual input image (degraded image) includes a noise component, use of an image restoration filter produced from the complete inverse number of the optical transfer function (OTF) as described above not only restores the degraded image, but also significantly amplifies the noise component. This is because such an image restoration filter raises the modulation transfer function (MTF), that is, the amplitude component of the optical system to 1 over an entire frequency range in a state where amplitude of the noise component is added to the amplitude component of the input image.

Although the MTF corresponding to the amplitude degradation by the optical system is returned to 1, power spectrum of the noise component is simultaneously raised, which results in amplification of the noise component according to a degree of raising of the MTF, that is, a restoration gain.

Therefore, the noise component included in the input image makes it impossible to provide a good restored image as an image for appreciation. Such raising of the noise component is shown by the following expressions where N represents the noise component:

$$G(u,v)=H(u,v)\cdot F(u,v)+N(u,v)$$

$$G(u,v)/H(u,v)=F(u,v)+N(u,v)/H(u,v).$$

As a method for solving such a problem, there is known, for example, a Wiener filter expressed by the following expression (1), which controls image restoration degree according to an intensity ratio (SNR) of an image signal and a noise signal.

$$M(u, v) = \frac{1}{H(u, v)} \frac{|H(u, v)|^2}{|H(u, v)|^2 + SNR^2} \quad (1)$$

In the above expression (1), M(u,v) represents a frequency characteristic of the Wiener filter, and |H(u,v)| represents an absolute value (MTF) of the optical transfer function (OTF). This method decreases, at each frequency, the restoration gain as the MTF is lower, in other words, increases the restoration gain as the MTF is higher. The MTF of general image capturing optical systems is high on a low frequency side and is low on a high frequency side, so that the method resultantly suppresses the restoration gain on the high frequency side of the image signal.

Figure 5:
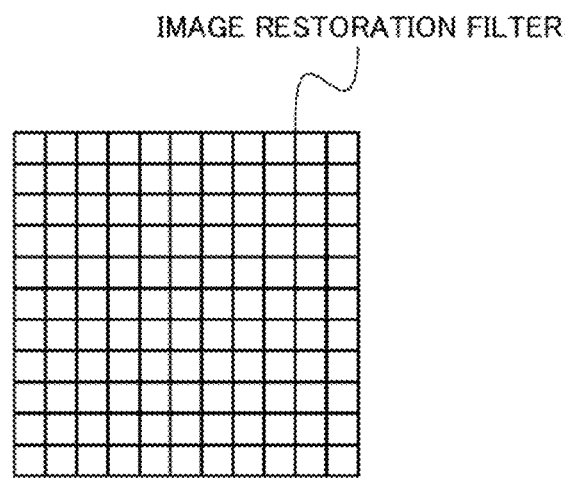
FIG. 5 shows an image restoration filter to be used in an image restoration process in each of Examples 1 and 2.
Figure 6:
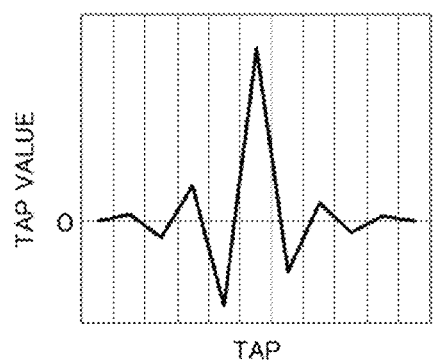
FIG. 6 shows tap values in the image restoration filter.

An example of the image restoration filter is shown in FIGS. 5 and 6. For the image restoration filter, the number of the taps (cells) is decided according to aberration characteristics of the optical system and required image restoration accuracy. The image restoration filter shown in FIG. 5 is a two-dimensional filter having 11×11 taps. Although FIG. 5 omits values (coefficient values) in the respective taps, FIG. 6 shows one cross section of this image restoration filter where values of the respective taps (hereinafter also referred to as "tap values") are shown by a polygonal line. A distribution of the tap values in the image restoration filter plays a role to return signal values (PSF) spatially spread due to the aberration to ideally, one point.

The image restoration process performs convolution of each tap value of the image restoration filter on each pixel (corresponding to each tap) of the input image. In the convolution, in order to improve the signal value of a certain pixel in the input image, that pixel is matched to a center tap of the image restoration filter. Then, a product of the pixel signal value of the input image and the tap value (coefficient value) of the image restoration filter is calculated for each corresponding pair of the pixel in the input image and the tap of the image restoration filter, and the signal value of the pixel corresponding to the center tap of the filter is replaced by a total sum of the products.

Figures 7A, 7B:
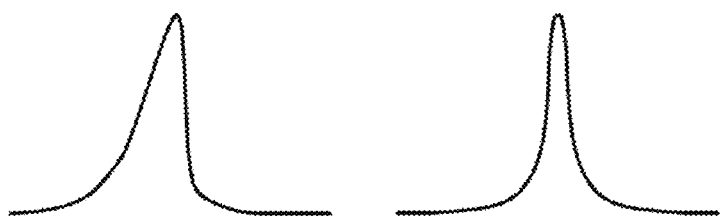
FIGS. 7A and 7B show correction of a point image by an image processing method in each of Examples 1 and 2.

Characteristics of the image restoration in a real space and a frequency space will be described with reference to FIGS. 7A, 7B, 8A and 8B. FIG. 7A shows a PSF (point spread function) before the image restoration, and FIG. 7B shows a PSF after the image restoration. FIG. 8A shows (a) an MTF before the image restoration and (b) an MTF after the image restoration. FIG. 8B shows (a) a PTF before the image restoration and (b) a PTF after the image restoration. The PSF before the image restoration asymmetrically spreads, and the PTF changes non-linearly with frequency due to the asymmetry. The image restoration process amplifies the MTF and corrects the PTF to zero, so that the PSF after the image restoration becomes symmetric and sharp.

This image restoration filter can be obtained by inverse Fourier transform of a function designed on the basis of an inverse function of the optical transfer function (OTF) of the optical system. In a case of using the Wiener filter, the image restoration filter for the convolution on the input image in the real space can be produced by the inverse Fourier transform of the expression (1).

Moreover, since the optical transfer function (OTF) changes according to image heights (positions in the input image) of the optical system even though the image capturing condition is same, the image restoration filter to be used is changed according to the image heights.

Specific Examples of the present invention will hereinafter be described.

EXAMPLE 1

Figure 9:
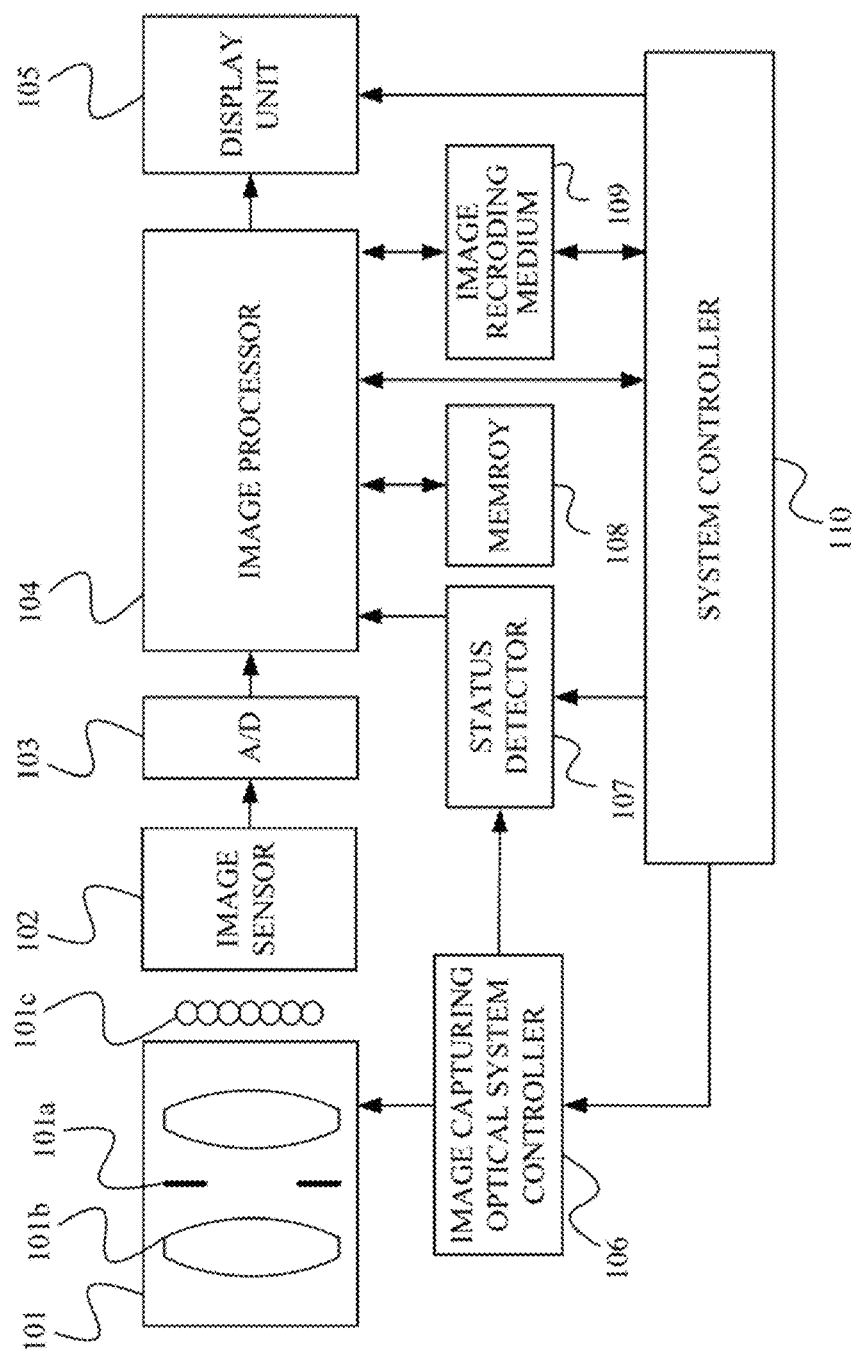
FIG. 9 is a block diagram showing an electrical configuration of the image pickup apparatus of Example 1.

FIG. 9 shows an electrical configuration of an image pickup apparatus that is a first (Example 1) of the present invention. Light from an object (not shown) enters into an image capturing optical system 101 including a main lens group 101*b* and an aperture stop 101*a*. The light exiting from the image capturing optical system 101 passes through a microlens array 101*c* and then is introduced to an image sensor 102. The image sensor 102 photoelectrically converts optical images formed by the image capturing optical system 101 and the microlens array 101*c* to output analog image capturing signals. The analog image capturing signals are converted into digital image capturing signals by an A/D converter 103, and are input to an image processor 104.

The image processor 104 performs various image processes on the digital image capturing signals to produce an input image as a first image, and then performs the image restoration process on the input image. The image processor 104 acquires the image capturing condition information of the image pickup apparatus at the time of producing the input image from a status detector 107. The image capturing condition information includes, as mentioned above, the aperture value of the image capturing optical system, the image capturing distance, the focal length of the image capturing optical system as a zoom lens, and the like.

The status detector 107 may acquire the image capturing condition information directly from a system controller 110, and may acquire the image capturing condition information relating to the image capturing optical system from an image capturing optical system controller 106.

The image processor 104 acquires the image restoration filter corresponding to the image capturing condition information. Specifically, the image processor 104 selects it from plural image restoration filters prestored in a memory 108, or newly produces it by using the prestored image restoration filters. The image processor 104 may select an optical transfer function corresponding to the image capturing condition information from plural optical transfer functions (OTF) prestored in the memory 108 and newly produce the image restoration filter corresponding to the image capturing condition information by using the selected optical transfer function. In addition, the image processor 104 may newly produce an optical transfer function corresponding to the image capturing condition information by using the prestored optical transfer functions and then perform the Fourier transform on the produced optical transfer function to produce the image restoration filter.

Then, the image processor 104 performs the image restoration process on the input image by using the acquired image restoration filter, and further performs an image reconstruction process by using a restored image (that is, an image obtained by the image restoration process) to produce an output image. A detailed description of the image reconstruction process will be made later. The image processor 104 serves as an image processing apparatus including an inputting part, an information acquiring part, a filter acquiring part and a processing part.

The output image as a second image produced by the image reconstruction process performed by the image processor 104 is stored in an image recording medium 109 in a predetermined format. Moreover, the output image is displayed on a display unit 105 constituted by an LCD or the like.

A series of the above-described processes is controlled by the system controller 110. Mechanical drive of the image capturing optical system 101 such as drive of a focus mechanism, a zoom mechanism and an aperture stop mechanism (described later) is controlled by the image capturing optical system controller 106 that receives control signals from the system controller 110.

The aperture stop 101a increases and decreases its aperture diameter to change its aperture value (F-number).

When acquiring information on positions and angles of light rays, which will be described later, the aperture diameter of the aperture stop 101a may be set to a large diameter such as a fully-opened aperture diameter in order to acquire the information on angles in a wide angle range. The information on positions and angles of light rays is hereinafter referred to as "light field information".

Moreover, the image pickup apparatus in this Example can control the F-number after the production of the input image by the image reconstruction process performed by the image processor 104. Thus, the image pickup apparatus can produce an output image corresponding to a small aperture diameter and a deep depth of focus after the image capturing for producing the input image.

The main lens group 101b is constituted by one lens or plural lenses, and includes a magnification-varying lens and a focus lens in this Example. The image pickup apparatus includes the zoom mechanism that moves the magnification-varying lens in an optical axis direction to perform variation of magnification and the focus mechanism that moves the focus lens in the optical axis direction to perform focusing. The focus mechanism includes an autofocus (AF) mechanism that is constituted by an actuator and its driver to move the focus lens for performing AF and a manual focus mechanism that moves the focus lens in response to a user's manual operation of an focus operation ring (not shown).

In the image pickup apparatus of this Example, the image processor 104 is capable of producing an output image whose focus position is adjusted (that is, a refocused output image) by the image reconstruction process after the image capturing for producing the input image. Therefore, the image pickup apparatus does not necessarily need the focus mechanism.

However, volume of the light field information is finite, and therefore a focus position adjustment range for the output image with respect to a focus position at the image capturing is also finite. Thus, performing the image capturing for producing the input image in a state where the image capturing optical system 101 driven by the focus mechanism is optically in-focus on a reference object makes it possible to perform good refocusing on positions around the reference object.

Figure 10:
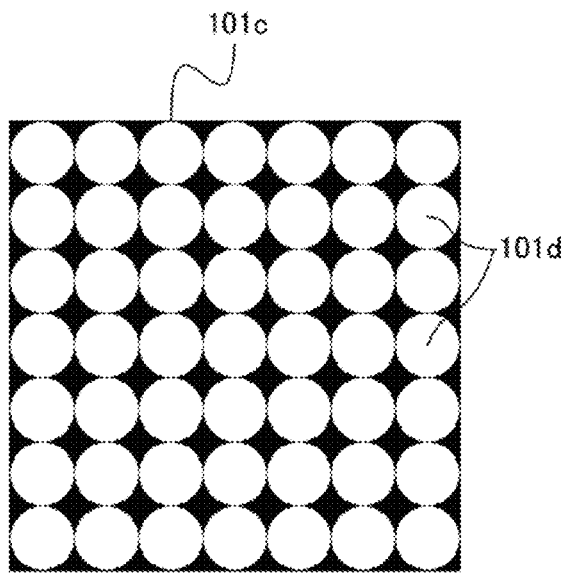
FIG. 10 shows the microlens array in each of Examples 1 and 2.

The microlens array 101c is disposed between the image capturing optical system 101 and the image sensor 102. The microlens array 101c is constituted by, for example, plural microlenses 101d two-dimensionally arranged as shown in FIG. 10. Each microlens 101d has a circular aperture. Although FIG. 10 only shows 7×7 microlenses 101d for explanation, the microlens actually includes a lot of microlenses such as hundreds×hundreds of microlenses or thousands×thousands of microlenses.

Moreover, the microlens 101d may be formed by various optical elements such as a solid lens, a liquid lens, a liquid crystal lens and an optical element whose refractive power is variable. A lens surface shape of the microlens 101d, which is at least one of an entrance surface and an exit surface, may be a curved surface such as a spherical surface or a non-spherical surface, or may be a planar surface.

FIG. 1 shows a specific optical configuration of the image capturing optical system 101, the microlens array 101c and the image sensor 102 shown in FIG. 9.

In FIG. 1, as having been described in the background art, the microlens array 101c is disposed at the imaging position of the image capturing optical system 101 that is constituted by the main lens group 101b and the aperture stop 101a. Moreover, the image sensor 102 is disposed at the rear of the microlens array 101c (that is, on an opposite side to an object side with respect to the microlens array 101c). The image sensor 102 is disposed at a position conjugate with an exit pupil of the image capturing optical system 101 with respect to the microlens array 101c. Furthermore, the microlens array 101c serves as the separator to prevent the light rays passing the certain point A in the object space from mixing with the light rays passing the point near the point A on the image sensor 102.

Figure 11:
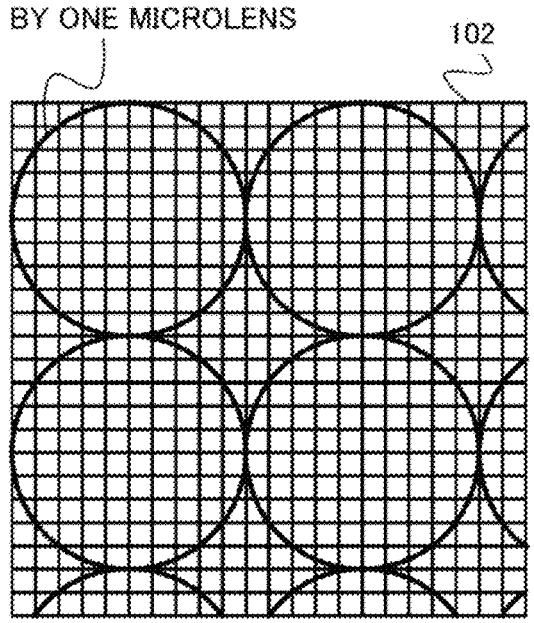
FIG. 11 shows optical images of the microlens array in each of Examples 1 and 2.

In FIG. 1, the upper ray, the principal pay and the lower ray from the point A are respectively received by mutually different pixels on the image sensor 102. Therefore, the image sensor 102 can acquire (photoelectrically convert) the light rays passing the point A and separated according to their angles. This applies also to light rays passing another point and being shown by dotted lines. Each microlens of the microlens array 101c forms an optical image of the exit pupil of the image capturing optical system 101 on the image sensor 102. Therefore, as shown in FIG. 11 that is an enlarged view of part of the image sensor 102, circular images of the exit pupil of the image capturing optical system 101, which are optical images viewed from the respective microlenses, are formed so as to be two-dimensionally arranged on the image sensor 102. FIG. 11 shows that one circular image is formed on approximately 11×11 pixels and therefore the information of angles of the light rays passing the point A is acquired at an angular resolution of 11×11.

The image capturing optical system 101 may include optical elements such as a low-pass filter and an infrared cutting filter. When the image capturing optical system 101 includes an optical element such as a low-pass filter influencing the optical transfer function (OTF) of the image capturing optical system 101, that optical element should be taken into account when producing the image restoration filter. Moreover, when using the infrared cutting filter, since it provides an influence to a PSF (which is an integration value of a point spread function (PSF) of a spectral wavelength) for each of R, G and B channels, particularly on the PSF for the R channel, the infrared cutting filter should be taken into account when producing the image restoration filter.

Figure 12:
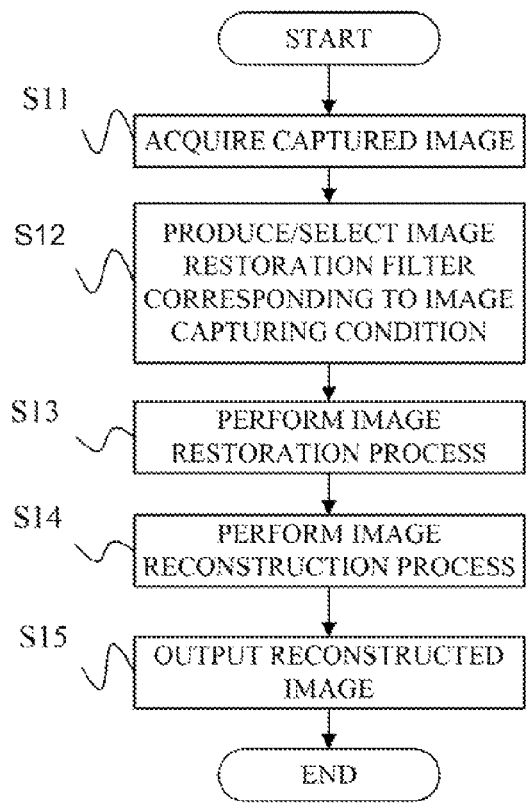
FIG. 12 is a flowchart showing a modified example of the image processing method in Examples 1 and 2.

FIG. 12 shows an image processing procedure (image processing method) performed in this Example. This image processing procedure is performed by the image processor 104 constituted by a computer according to an image processing program as a computer program. The image processing program may be installed via a non-transitory storage medium storing the program therein.

At step S11, the image processor 104 acquires an input image (hereinafter also referred to as "a captured image") by producing it. The captured image is an image produced by photoelectrically converting the optical images of the exit pupil of the image capturing optical system 101 shown in FIG. 11.

Next at step S12, the image processor 104 acquires the image capturing condition information at the time of producing the captured image by the image pickup apparatus, and then acquires the image restoration filter corresponding to, in other words, appropriate for the image capturing condition (actual image capturing condition) shown by the acquired image capturing condition information. Specifically, as mentioned above, the image processor 104 selects one image restoration filter corresponding to the image capturing condition from the plural image restoration filters prestored in the memory 108 or newly produces the image restoration filter corresponding to the image capturing condition by using the prestored image restoration filters. Such a new image restoration filter is produced, for example, as follows. First, data of the image restoration filters corresponding to discretely selected image capturing conditions such as the focal lengths, the aperture values and the image capturing distances are prestored in the memory 108. Then, when the actual image capturing condition is different from the image capturing conditions prestored in the memory 108, an image restoration filter is produced by interpolation calculation using the image restoration filters corresponding to two or more image capturing conditions near the actual image capturing condition. Such production of the new image restoration filter makes it possible to reduce amount of the data of the image restoration filters to be prestored in the memory 108. The interpolation calculation may be performed by any method, such as bilinear interpolation (linear interpolation) or bicubic interpolation.

Moreover, when changing the image restoration filter according to position in the captured image, similarly, an image restoration filter corresponding to an actual position is produced by interpolation calculation using prestored image restoration filters corresponding to two or more specific positions near the actual position among discretely selected specific positions in the captured image.

The data prestored in the memory 108 may be not the data of the image restoration filters, but data relating to optical transfer functions on the basis of which the image restoration filter can be produced, such as PSFs, OTFs, MTFs or PTFs. In this case, the image restoration filter corresponding to the image capturing condition can be produced from the data relating to the optical transfer functions.

Figure 13:
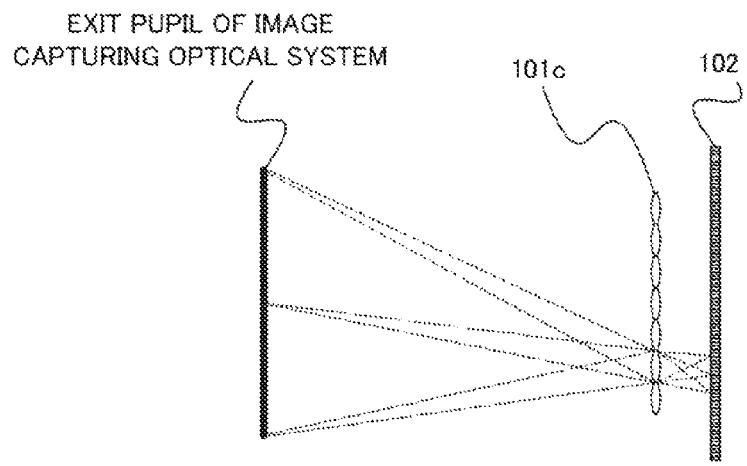
FIG. 13 shows optical images of an exit pupil of the image capturing optical system, which are formed by the microlens array in Example 1.
Figure 14A:
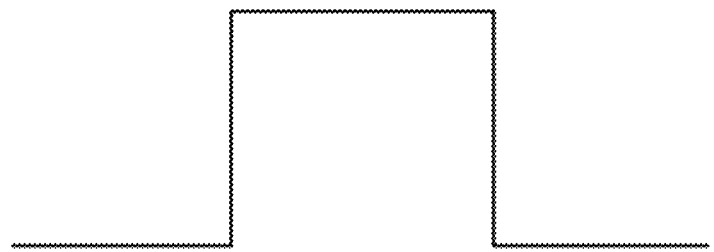
FIGS. 14A, 14B and 14C show a correction effect in each of Examples 1 and 2.
Figure 14B:
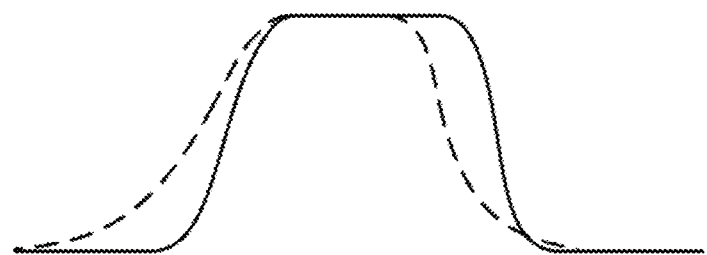

Next at step S13, the image processor 104 performs the image restoration process on the captured image by using the image restoration filter acquired at step S12 to obtain a restored image (restored first image) as a captured image after the image restoration process. FIG. 13 shows that one microlens forms the optical image of the exit pupil of the image capturing optical system 101 on the image sensor 102. FIG. 14A shows a cross section of an ideal exit pupil image when no aberration is generated in the microlens shown in FIG. 13. However, actually, as shown in FIG. 14B, chromatic aberration and asymmetric aberration are generated in the microlens. A solid line and a dotted line in FIG. 14B show two color components of the captured image.

Figure 14C:
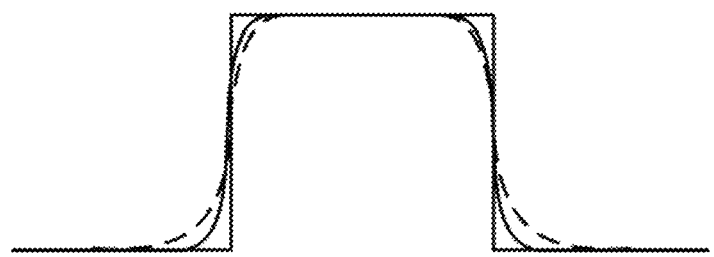

FIG. 14C shows a restored image as a result of performing the image restoration process on the captured image (degraded image) shown in FIG. 14B by using the image restoration filter produced based on the optical transfer function (OTF) of the microlens. The restored image is corrected such that the chromatic aberration and the asymmetric aberration are reduced and is sharpened.

As to design of the image restoration filter, as a restoration degree (restoration gain) is increased, the restored image becomes closer to the ideal image shown in FIG. 14A. However, the increased restoration degree not only sharpens the image, but also amplifies noise. Thus, proper adjustment of the restoration degree makes it possible to appropriately set balance of a sharpening degree of the image and a noise amount. As a result, the restored image shown in FIG. 14C is obtained.

Figure 4A:
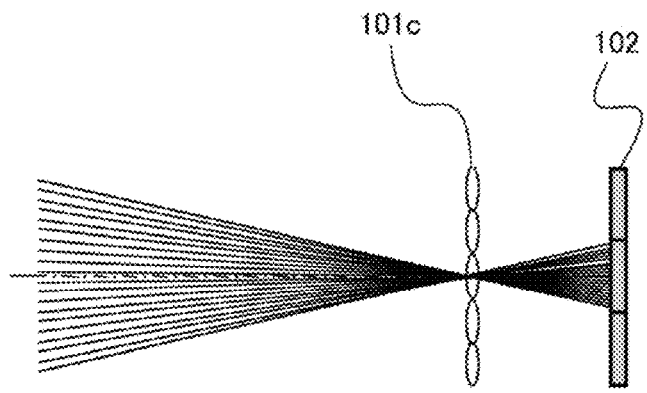
FIGS. 4A and 4B show an influence of aberration generated in the image capturing optical system.
Figure 4B:
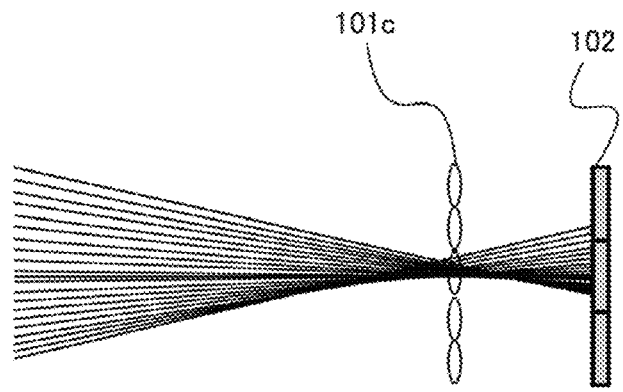

Moreover, as understood from FIG. 4B, the aberration generated in the image capturing optical system also may become a factor that degrades the light field information. This is because, even though the microlens generates no aberration, aberration is generated in the exit pupil of the image capturing optical system. In this case, the light field information included in the degraded image shown in FIG. 14B is degraded by the aberrations generated in the image capturing optical system and the microlens.

In order to correct such degradation of the light field information, the image processor 104 produces the image restoration filter based on the OTF of the image capturing optical system and the OTF of the microlens, and performs the image restoration process on the degraded image. Thereby, the image processor 104 can provide a restored image in which degradation due to the aberrations generated in the image capturing optical system and the microlens are corrected well.

The above-described image restoration process is a process to correct a PSF having spread due to the aberration to, ideally, a point image. However, the ideal image shown in FIG. 14A is a defocused (out-of-focus) image captured at a position away from the imaging position of the image capturing optical system. Therefore, the method of producing the image restoration filter is different from general image restoration processes.

That is, the image restoration filter to be used in this Example is produced based on the following expression (2):

$$R(u, v) = \frac{rH(u, v)}{H(u, v)} \frac{|H(u, v)|^2}{|H(u, v)|^2 + C^2} \quad (2)$$

where R(u,v) represents a frequency characteristic of the image restoration filter, H(u,v) represents the optical transfer function (OTF) of the optical system, rH(u,v) represents a target OTF after the image restoration, and C represents a control parameter for the restoration degree.

When the object is a point image, since the frequency characteristic of the object is represented by H(u,v), the following expression (3) multiplying H(u,v) by R(u,v) shows an OTF after the image restoration.

$$H(u, v)R(u, v) = rH(u, v)\frac{|H(u, v)|^2}{|H(u, v)|^2 + C^2} \quad (3)$$

In the expression (3), when setting C to 0 such that the restoration degree becomes maximum, the OTF after the image restoration becomes rH(u,v) that is the target OTF. When the restoration degree is not maximum, as the restoration degree becomes closer to the maximum, the OTF after the image restoration becomes closer to the target OTF. Using the conventional Wiener filter shown by the expression (1) corrects the defocused image produced for acquiring the light field information to an in-focus point image, which makes it impossible to acquire intended information.

Moreover, when in the expression (3) rH(u,v) has only a real part and is rotationally symmetric with respect to (0,0) in a frequency space of (u,v), the phase is corrected and the amplitude becomes rotationally symmetric, the asymmetry of the restored image can be removed. In a state where only the phase has been corrected, image spread becomes point symmetric, but does not become rotationally symmetric. Furthermore, correcting the amplitude such that it becomes rotationally symmetric makes the image spread rotationally symmetric, too.

On the other hand, using an image restoration filter shown by the following expression (4) can correct only the degradation of the phase.

$$R(u, v) = \frac{|H(u, v)|}{H(u, v)} \quad (4)$$

The restored image produced by the image restoration process at step S13 is temporarily stored in the memory 108 in the image pickup apparatus, and is read from the memory 108 at the following step S14.

However, using the following method makes such temporal storing of the restored image in the memory 108 unnecessary. The method first performs the image restoration process on a partial area of the captured image, and performs the image reconstruction process on that restored partial area to produce a partial area of the output image. Next, the method changes the partial area on which the image restoration process is performed, and similarly produces another partial area of the output image. The method repeats the above processes until the image restoration process and the image reconstruction process for the entire captured image are finished, which enables production of the entire output image. The method enables, even if a capacity of the memory 108 is small, production of the output image without lack of the capacity.

Next, at step S14, the image processor 104 performs the image reconstruction process on the restored image produced at step S13. The image reconstruction process may be performed by a method disclosed in NPL 1. Briefly, the method rearranges intensities corresponding to positions (converted positions on the image sensor 102) and angles of respective light rays, according to a purpose of producing the output image after acquisition of the captured image, such as a change of focus position, a change of F-number, or a change of view point.

Moreover, plural output images whose focus positions, F-numbers or view points are mutually different can be produced from one captured image. That is, acquiring the light field information as the captured image enables production of plural output images acquired in virtually different image capturing conditions.

Furthermore, the image reconstruction process may shift positions of plural first images as parallax images and combine them to produce a second image as a refocused image. Changing a position shift amount of the parallax images enables control of a refocus amount of the refocused image. This image reconstruction process also produces the second image based on information on positions and angles of light rays (light field information) obtained from the first image(s).

EXAMPLE 2

Figure 2:
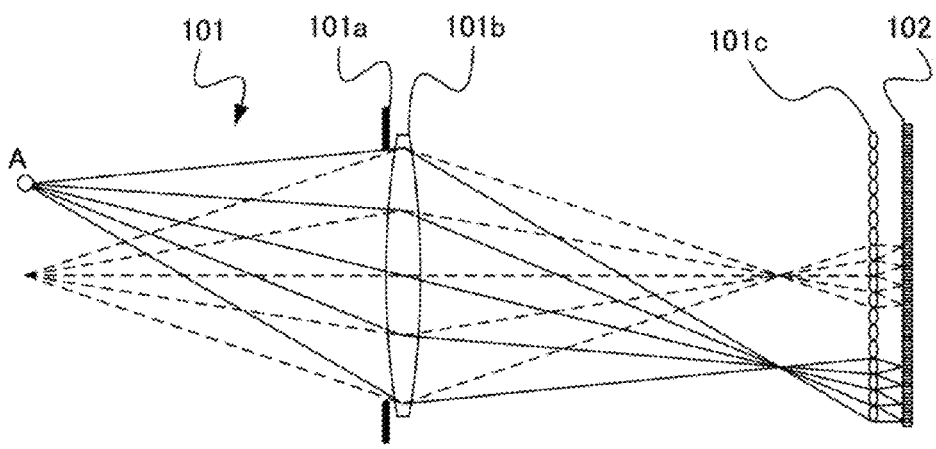
FIG. 2 shows an image capturing optical system, a microlens array and an image sensor of an image pickup apparatus that is Example 2 of the present invention.
Figure 3:
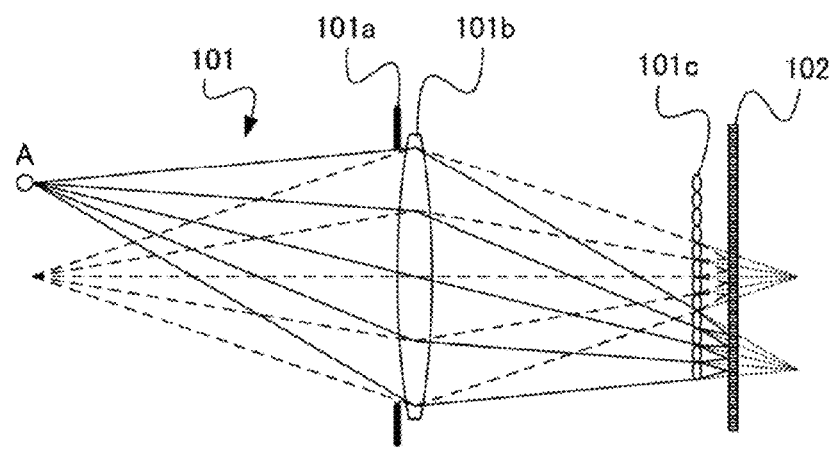
FIG. 3 shows an image capturing optical system, a microlens array and an image sensor of another image pickup apparatus that is Example 2.

FIGS. 2 and 3 show two types of image pickup apparatuses each being a second Example of the present invention and having mutually different arrangements of an image capturing optical system 101, a microlens array 101c and an image sensor 102. These image pickup apparatus have the same electrical configuration as that of Example 1 shown in FIG. 9.

Figure 15:
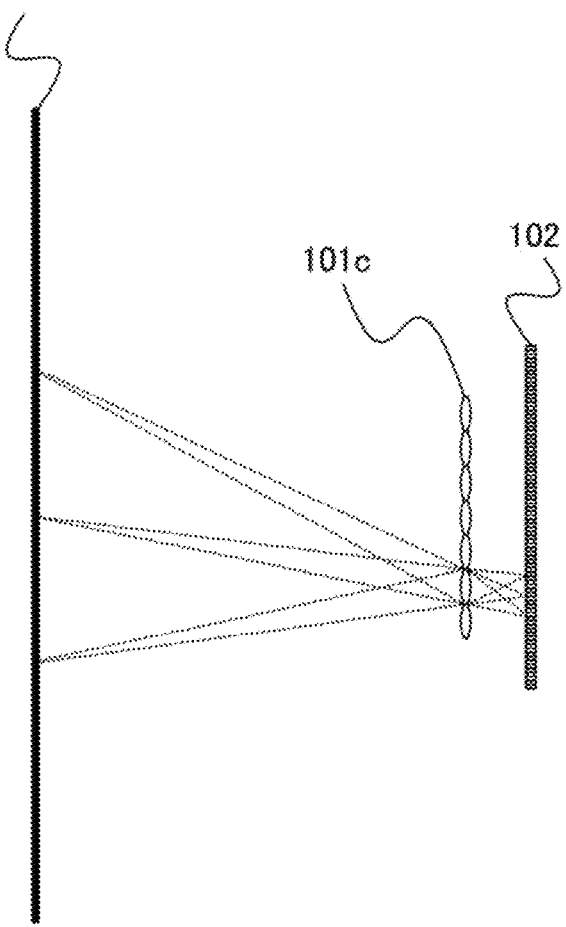
FIG. 15 shows aerial images of the image capturing optical system on the image sensor, which are formed by the microlens array in Example 2.

In FIG. 2, as having been described in the background art, the microlens array 101c is disposed at the rear of the imaging position of the image capturing optical system 101 (that is, of the main lens group 101b). The microlenses of the microlens array 101c cause the light lays forming optical images at the imaging position of the image capturing optical system 101 to reform optical images on the image sensor 102. This configuration enables acquisition of the light rays passing the point A and being separated according to their angles. FIG. 15 shows that one microlens reforms an aerial image of the image capturing optical system 101 on the image sensor 102 in the configuration shown in FIG. 2.

On the other hand, in FIG. 3, also as having been described in the background art, the microlens array 101c is disposed at the front of the imaging position of the image capturing optical system 101 (that is, of the main lens group 101b). The microlenses of the microlens array 101c cause the light rays from the image capturing optical system 101 to form optical images on the image sensor 102. This configuration enables acquisition of the light rays passing the point A and being separated according to their angles.

In each of the configuration shown in FIGS. 2 and 3, the microlens array 101c is disposed at a position away from the imaging position of the image capturing optical system 101 and thereby causes the light from the image capturing optical system 101 to form the optical images on the image sensor 102 disposed at a position conjugate with the imaging position. However, while each microlens in FIG. 2 reforms a real image of the image capturing optical system 101, each microlens in FIG. 3 forms a virtual image of the image capturing optical system 101.

Since in the configuration shown in each of FIGS. 2 and 3 each microlens reforms an image of the aerial image of the image capturing optical system 101 on the image sensor 102, a plurality of the aerial images of the image capturing optical system 101 are repeatedly arranged on the image sensor 102. The repeatedly arranged images on the image sensor 102 are formed by light rays whose angles are mutually slightly different, so that a similar image reconstruction process to that described in Example 1 can be performed though rearrangement pattern in the image reconstruction process is different from that in Example 1.

In each of the configuration shown in FIGS. 2 and 3, the microlens causes forms the image of the aerial image of the image capturing optical system 101 on the image sensor 102. Therefore, on the image sensor 102, as shown in FIG. 11 that is an enlarged view thereof, plural aerial images of the image capturing optical system 101 reformed by the respective microlenses are two-dimensionally arranged. The aerial images reformed on the image sensor 102 by the microlenses adjacent to each other include mutually overlapping portions. The overlapping portions are shifted according to position on the image sensor 102. Such overlap portions of the aerial images reformed by two microlenses correspond to images acquired by capturing a same point of the object from mutually different angles.

The angular resolution is decided, as shown in FIGS. 2 and 3, according to a number of the microlenses separating the light rays from the certain point A. For example, the cross section in each of FIGS. 2 and 3 shows that the light rays from the point A into four groups.

An image processing procedure in this Example is basically same as that in Example 1 described with reference to FIG. 12. However, as described with reference to FIG. 11, the captured image acquired at step S11 is produced by photoelectric conversion of reformed images of the aerial images of the image capturing optical system 101, each reformed image being reformed by each microlens.

Moreover, an outline of the image restoration process in this Example is same as that described in Example 1 with reference to FIGS. 14A and 14B. However, in this Example. FIG. 14A shows a cross section of an ideal image of the exit pupil when no aberration is generated in the microlens shown in FIG. 15.

Since in this Example the optical image formed on the image sensor 102 is a real image of the object, the OTF and furthermore the image restoration filter can be produced by regarding the microlens as part of the image capturing optical system 101, in respect of image formation on the image sensor 102. Specifically, multiplying the OTF of the image capturing optical system 101 by the OTF of the microlens enables production of the OTF of the entire optical system.

As described above, each of Examples 1 and 2 acquires accurate light field information (information on positions and angles of light rays) from the first image in which the influences of the aberrations generated in the image capturing optical system and the optical element array have been sufficiently reduced. Thus, each of Examples 1 and 2 enables, by using the accurate light field information, production of the second image (reconstructed image) as, for example, an image corresponding to an arbitrary focus position or an image viewed from an arbitrary viewing direction, with good accuracy.

EXAMPLE 3

Although Examples 1 and 2 have described the image pickup apparatuses using the image processing method (that is, the image pickup apparatuses provided with the image processing apparatus), a third Example (Example 3) of the present invention will describe a case where the image processing method is implemented by an image processing program installed to a personal computer. In this case, the personal computer corresponds to an image processing apparatus. The personal computer acquires a captured image (non-restored image) produced by an image pickup apparatus through wired or wireless communication from the image pickup apparatus, or through a line of Internet from another personal computer. The personal computer may acquire the captured image through an image recording medium in which the captured image is recorded. Then, the personal computer that has acquired the captured image performs the image restoration process and the image reconstruction process according to the image processing program, and outputs a resulting reconstructed image.

While the present invention has been described with reference to exemplary Examples, it is to be understood that the invention is not limited to the disclosed exemplary Examples. The scope of the following claims is to be accorded the broadest interpretation so as to encompass all such modifications and equivalent structures and functions.

This application claims the benefit of Japanese Patent Application No. 2011-198286, filed on Sep. 12, 2011, which is hereby incorporated by reference herein in its entirety.

INDUSTRIAL APPLICABILITY

The present invention provides an image processing technique enabling production of a good output image in a plenoptic camera or the like.

The invention claimed is:

1. An image processing method of producing, based on information on positions and angles of light rays obtained from a first image, a second image, the first image being produced by using an image pickup apparatus that introduces the light rays from an image capturing optical system to an image sensor through an optical element array, the method comprising the steps of:

acquiring the first image and information on an image capturing condition at a time of producing the first image;

acquiring an image restoration filter corresponding to the information on the image capturing condition and corresponding to respective optical transfer functions of the image capturing optical system and the optical element array;

performing an image restoration process on the first image by using the image restoration filter to produce a restored first image; and producing the second image by performing an image reconstruction process on the restored first image, wherein the first image is a defocused image captured at a position away from an imaging position of the image capturing optical system, and wherein the image restoration filter is a filter to correct degradation of the first image due to an aberration generated in the image capturing optical system and optical element array without correcting a PSF having spread in the first image to a point image.

2. The image processing method according to claim 1, wherein, in the image pickup apparatus, the optical element array is disposed at the imaging position of the image capturing optical system, the image sensor is disposed at a position conjugate with an exit pupil of the image capturing optical system with respect to the optical element array, and the first image is produced through photoelectric conversion of optical images of the exit pupil by the image sensor.

3. An image processing apparatus configured to produce, based on information on positions and angles of light rays obtained from a first image, a second image, the first image being produced by using an image pickup apparatus that introduces the light rays from an image capturing optical system to an image sensor through an optical element array, the image processing apparatus comprising:

an inputting part configured to acquire the first image and information on an image capturing condition at a time of producing the first image;

a filter acquiring part configured to acquire an image restoration filter corresponding to the information on the image capturing condition and corresponding to respective optical transfer functions of the image capturing optical system and the optical element array;

a processing part configured to perform an image restoration process on the first image by using the image restoration filter to produce a restored first image; and an image producing part configured to produce the second image by performing an image reconstruction process on the restored first image, wherein the first image is a defocused image captured at a position away from an imaging position of the image capturing optical system, and wherein the image restoration filter is a filter to correct degradation of the first image due to an aberration generated in the image capturing optical system and optical element array without correcting a PSF having spread in the first image to a point image.

4. An image pickup apparatus comprising:

an optical element array through which light rays from an image capturing optical system pass;

an image sensor configured to photoelectrically convert the light rays from the optical element array; and an image processing apparatus configured to produce a first image by using output from the image sensor and configured to produce, based on information on positions and angles of the light rays obtained from the first image, a second image, wherein the image processing apparatus comprising:

an inputting part configured to acquire the first image and information on an image capturing condition at a time of producing the first image;

a filter acquiring part configured to acquire an image restoration filter corresponding to the information on the image capturing condition and corresponding to respective optical transfer functions of the image capturing optical system and the optical element array;

a processing part configured to perform an image restoration process on the first image by using the image restoration filter to produce a restored first image; and an image producing part configured to produce the second image by performing an image reconstruction process on the restored first image, wherein the first image is a defocused image captured at a position away from an imaging position of the image capturing optical system, and wherein the image restoration filter is a filter to correct degradation of the first image due to an aberration generated in the image capturing optical system and optical element array without correcting a PSF having spread in the first image to a point image.

5. A non-transitory storage medium storing an image processing program that causes a computer to execute a method of producing, based on information on positions and angles of light rays obtained from a first image, a second image, the first image being produced by using an image pickup apparatus that introduces the light rays from an image capturing optical system to an image sensor through an optical element array, the method comprising:

acquiring the first image and information on an image capturing condition at a time of producing the first image;

acquiring an image restoration filter corresponding to the information on the image capturing condition and corresponding to respective optical transfer functions of the image capturing optical system and the optical element array;

performing an image restoration process on the first image by using the image restoration filter to produce a restored first image; and producing the second image by performing an image reconstruction process on the restored first image, wherein the first image is a defocused image captured at a position away from an imaging position of the image capturing optical system, and wherein the image restoration filter is a filter to correct degradation of the first image due to an aberration generated in the image capturing optical system and optical element array without correcting a PSF having spread in the first image to a point image.

6. An image processing method of producing, based on information on positions and angles of light rays obtained from a first image, a second image, the first image being produced by using an image pickup apparatus that introduces the light rays from an image capturing optical system to an image sensor through an optical element array, the method comprising the steps of:

acquiring the first image and information on an image capturing condition at a time of producing the first image;

acquiring an image restoration filter corresponding to the information on the image capturing condition and corresponding to respective optical transfer functions of the image capturing optical system and the optical element array;

performing an image restoration process on the first image by using the image restoration filter to produce a restored first image; and producing the second image by performing an image reconstruction process on the restored first image, wherein the image restoration filter is based on the following expression:

$$R(u, v) = \frac{rH(u, v)}{H(u, v)} \frac{|H(u, v)|^2}{|H(u, v)|^2 + C^2}$$

where R(u,v) represents a frequency characteristic of the image restoration filter, H(u,v) represents the optical transfer function (OTF) of the optical system, rH(u,v) represents a target OTF after the image restoration, and C represents a control parameter for the restoration degree.

* * * * *